United States Patent [19]
Fujino

[11] Patent Number: 5,952,951
[45] Date of Patent: Sep. 14, 1999

[54] CHOPPER COMPARATOR AND A/D CONVERTER

[75] Inventor: Shinichiro Fujino, Nagasaki, Japan

[73] Assignee: Sony Corporation, Tokyo, Japan

[21] Appl. No.: 08/910,762

[22] Filed: Aug. 13, 1997

[30]  Foreign Application Priority Data

Aug. 16, 1996 [JP] Japan .................................. 8-234752

[51] Int. Cl.$^6$ ................................................ H03M 1/12
[52] U.S. Cl. ............................ 341/159; 341/156; 326/84
[58] Field of Search ..................................... 341/156, 158, 341/159; 326/34, 83, 121

[56] References Cited

U.S. PATENT DOCUMENTS

| | | |
|---|---|---|
| 4,274,014 | 6/1981 | Schade, Jr. ............................. 307/585 |
| 4,791,326 | 12/1988 | Vajdic et al. ............................. 307/571 |
| 5,614,847 | 3/1997 | Kawahara et al. ....................... 326/121 |
| 5,835,045 | 11/1998 | Ogawa et al. ........................... 341/159 |

*Primary Examiner*—Howard L. Williams
*Attorney, Agent, or Firm*—Hill & Simpson

[57] ABSTRACT

A chopper comparator is constructed by connecting current control transistors $Q_{15}$ to $Q_{17}$ comprising p-channel MOSFETs between CMOS inverters 3 to 5 and a power source 7 to supply a power voltage $V_{DD}$. A control signal $V_C$ to control a current flowing in the CMOS inverters 3 to 5 is supplied to gates of the current control transistors $Q_{15}$ to $Q_{17}$. In case of constructing the A/D converter, the chopper comparator is used.

8 Claims, 8 Drawing Sheets

CHOPPER COMPARATOR AND A/D CONVERTER

BACKGROUND OF THE INVENTION

1. Field of the Invention

The invention relates to a chopper comparator. and an A/D converter.

2. Description of the Related Art

In a recent stream of a system-on-silicon due to a progress of formation of a fine pattern of a semiconductor process, a demand to assemble a high-speed A/D converter into a large scale integrated circuit (LSI) is increasing. Even in what is called a high-speed A/D converter, however, its conversion frequency varies in a range from several MHz to tens of MHz in accordance with a use object. As such a high-speed A/D converter, there have been known a flash type A/D converter for converting an inputted analog signal to digital signals of n bits in parallel, a 2-step flash type A/D converter for divisionally converting an inputted analog signal at two stages of upper bits and lower bits, and the like.

Figures 1, 2A:
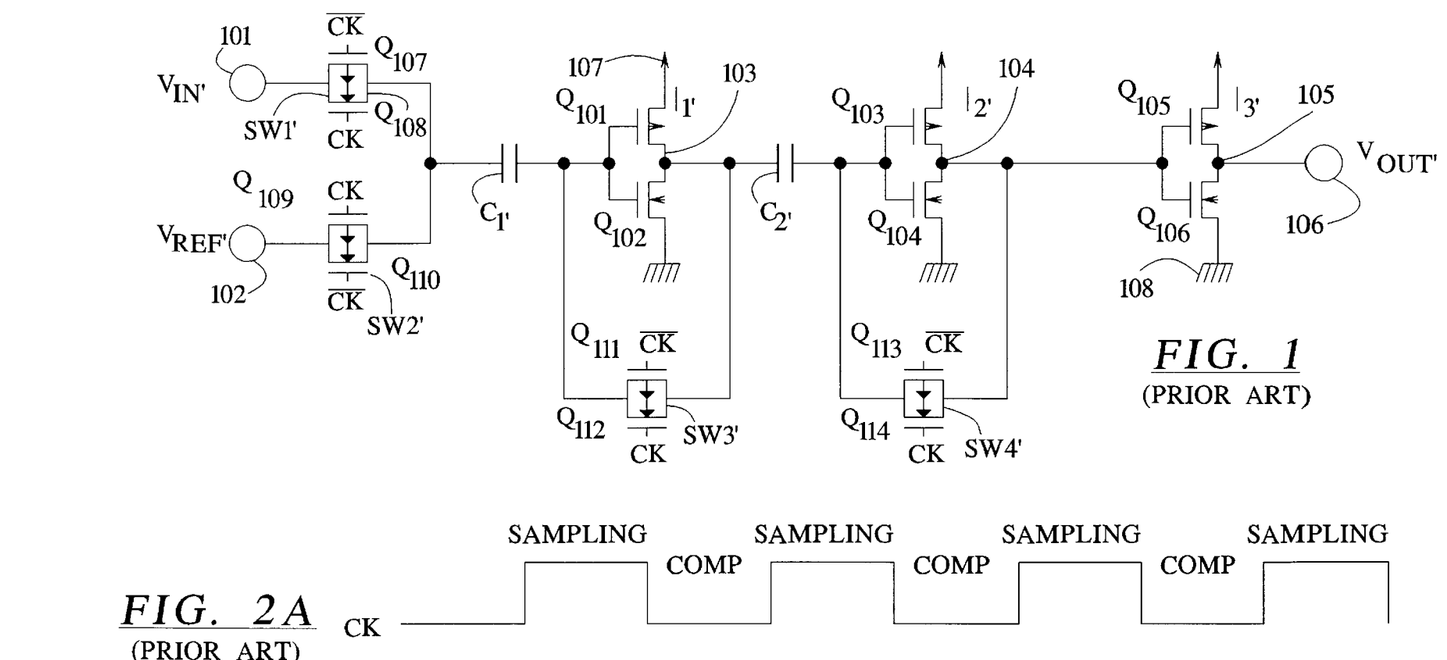
FIG. 1 is a circuit diagram showing a conventional chopper comparator.
FIGS. 2A and 2B are schematic diagrams in association with the operation of the conventional chopper comparator.

FIG. 1 is a circuit diagram showing a conventional chopper comparator which is used in a conventional flash type or 2-step flash type A/D converter.

As shown in FIG. 1, the conventional chopper comparator has: an input terminal 101 for an analog input voltage $V_{IN}$; an input terminal 102 for a reference voltage $V_{ref}$; CMOS inverters 103 to 105 of three stages; an output terminal 106 for an output voltage $V_{OUT}$; capacitors $C_1'$ and $C_2'$; and switches SW1' to SW4' constructed by CMOS analog switches. The input terminals 101 and 102 are connected to one end of the capacitor $C_1'$ through the switches SW1' and SW2'. The other end of the capacitor $C_1'$ is connected to an input terminal of the CMOS inverter 103. An output terminal of the CMOS inverter 103 is connected to an input terminal of the CMOS inverter 104 through the capacitor $C_2'$. The input and output terminals of the CMOS inverter 103 are connected through the switch SW3'. Similarly, input and output terminals of the CMOS inverter 104 are connected through the switch SW4'. The output terminal of the CMOS inverter 104 is connected to an input terminal of the CMOS inverter 105. An output terminal of the CMOS inverter 105 is connected to the output terminal 106 for the output voltage $V_{OUT}$.

Reference numeral 107 denotes a power source for supplying a power voltage $V_{DD}$ and 108 denotes a power source for supplying a power voltage $V_{SS}$. Reference characters $Q_{101}$ to $Q_{106}$ denote transistors constructing the CMOS inverters 103 to 105. In this case, the transistors $Q_{101}$, $Q_{103}$, and $Q_{105}$ are p-channel MOSFETs as load transistors and the transistors $Q_{102}$, $Q_{104}$, and $Q_{106}$ are n-channel MOSFETs as driver transistors.

Reference characters $Q_{107}$ to $Q_{114}$ indicate transistors constructing the switches SW1' to SW4'. A clock signal CK or an inverted clock signal $\overline{CK}$ is supplied to the transistors $Q_{107}$ to $Q_{141}$, thereby controlling the ON/OFF operations of the switches SW1' to SW4'. In this case, the switches SW1', SW3', and SW4' are turned on for a period of time during which the clock signal CK is at the high level and are turned off for a period of time during which the clock signal CK is at the low level. On the other hand, the switch SW2' is turned on for a period of time during which the clock signal CK is at the low level and is turned off for a period of time of the high level.

The operation of the conventional chopper comparator constructed as mentioned above will now be described.

That is, in the chopper comparator, when the clock signal CK is set to the high level, the switches SW1', SW3', and SW4' are turned on and the switch SW2' is turned off. For this period, the analog input voltage $V_{IN}$ from the input terminal 101 is supplied to the capacitor $C_1'$ and is sampled and a self-offset cancellation of the CMOS inverters 103 and 104 is performed. For this sampling period, in principle, predetermined operation currents $I_1'$ to $I_3'$ flow into the CMOS inverters 103 to 105. When electric potentials at the input and output terminals of the CMOS inverters 103 to 105 are equal, the operation currents $I_1'$ to $I_3'$ at this time correspond to DC currents which flow into the CMOS inverters 103 to 105.

Subsequently, when the clock signal CK is set to the low level, the switches SW1', SW3', and SW4' are turned off and the switch SW2' is turned on. For this period, the reference voltage $V_{ref}$ from the input terminal 102 is supplied to the capacitor C1', so that a level of the analog input voltage $V_{IN}$ which was sampled before is compared with that of the reference voltage $V_{ref}$. The voltage which is applied to the capacitor $C_1'$ at this time is inverted by the CMOS inverter 103. Further, an output of the CMOS inverter 103 is amplified by the CMOS inverters 104 and 105 and is generated as an output voltage $V_{OUT}$ from the output terminal 106. In this case, when $V_{IN} \geq V_{ref}$, the output voltage $V_{OUT}$ corresponding to "1" is generated and, when $V_{IN} < V_{ref}$, the output voltage $V_{OUT}$ corresponding to "0" is generated. For this comparing period of time, the operation currents $I_1'$ to $I_3'$ of the CMOS inverter 103 to 105 are equal to almost 0.

Hereinafter, the above-mentioned sampling operation and comparing operation are repeated in response to the clock signal CK.

Figure 2B:
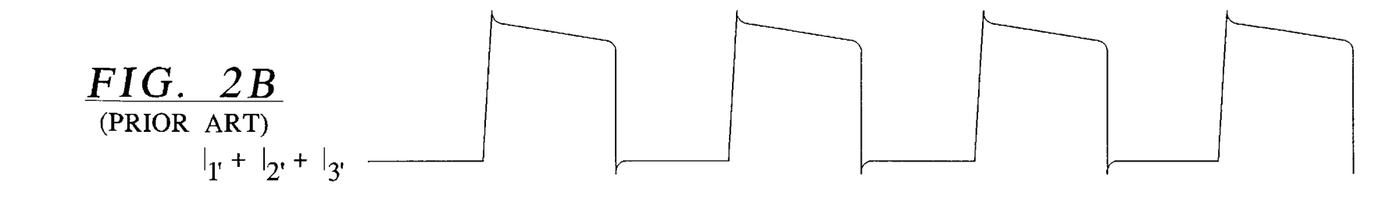
Figure 10:
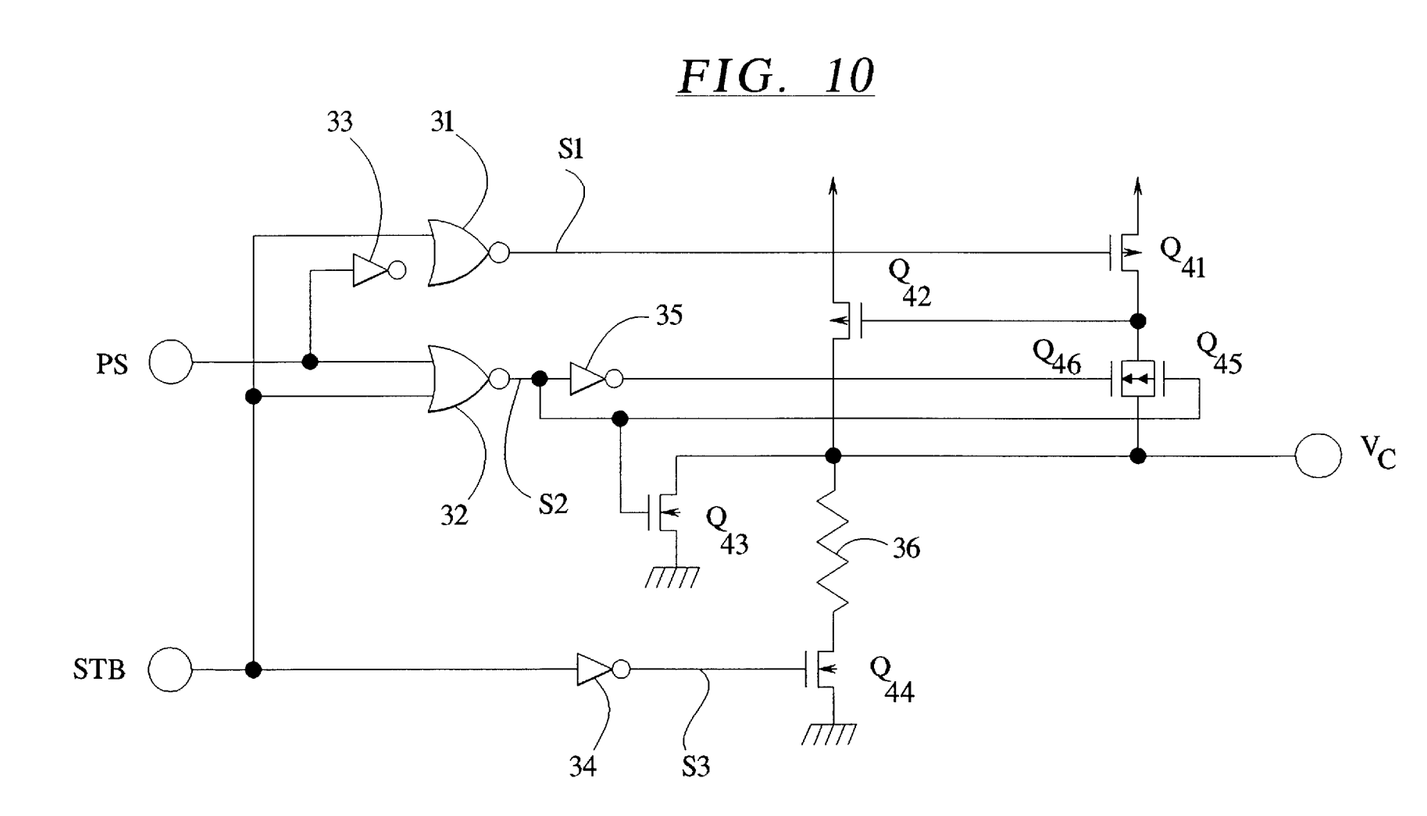
FIG. 10 is a circuit diagram showing an example of a controller of the A/D converter according to the sixth embodiment of the invention.

FIGS. 2A and 2B are schematic diagrams showing a current consumption in association with the operation of the conventional chopper comparator. In this instance, FIG. 2A shows a waveform of the clock signal CK and FIG. 2B shows a waveform of the consumed current. In the conventional chopper comparator, any current is hardly consumed except for the operation currents $I_1'$ to $I_3'$ of the CMOS inverters 103 to 105. Therefore, as shown in FIG. 10, the current consumption of the conventional chopper comparator is equal to $(I_1'+I_2'+I_3')$ which is the total amount of the operation currents $I_1'$ to $I_3'$ of the CMOS inverters 103 to 105.

The n-bit flash type A/D converter is constructed by using the $(2^n-1)$ foregoing conventional chopper comparators. The n-bit 2-step flash type A/D converter is constructed by using the $[(2^{n/2}-1)+2(2^{n/2}-1+a)]$: where, (a) denotes the number of correction bits] foregoing conventional chopper comparators. Specifically speaking, for example, in case of an A/D converter of 8-bit 2-step flash type for video, the total number of chopper comparators is equal to 57 (where, the number (a) of correction bits assumes 3).

In the conventional chopper comparator, ordinarily, as the operation currents $I_1'$ to $I_3'$ of the CMOS inverters 103 to 105 are larger, namely, as the current consumption is larger, gains of the CMOS inverters 103 to 105 increase. On the other hand, the gains of the CMOS inverters 103 to 105 decide a conversion speed of the chopper comparator. Consequently, in the conventional chopper comparator, when the conversion speed is determined, the current consumption is naturally decided.

However, the conventional A/D converter constructed by using a number of conventional chopper comparators as mentioned above has the following problem.

That is, when it is required that the A/D converter operates at a low electric power consumption, it is indispensable to reduce the current consumption of the sole chopper comparator. As a method of coping with such a situation, there is a general method of reducing a ratio W/L of a gate width W to a gate length L of each of the transistors $Q_{101}$ to $Q_{106}$ constructing the CMOS inverters 103 to 105 in the above-mentioned conventional chopper comparator shown in FIG. 1.

On the other hand, the gain of each of the CMOS inverters 103 to 105 is decided by a ratio W/L of the gate width W to the gate length L of each of the transistors $Q_{101}$ to $Q_{106}$. Therefore, ordinarily, the ratio W/L of the gate width W to the gate length L of each of the transistors $Q_{101}$ to $Q_{106}$ constructing the CMOS inverters 103 to 105 is decided in accordance with the conversion speed which is required for the chopper comparator, so that the current consumption of the chopper comparator is also determined. Consequently, in order to realize a proper conversion speed, it is the best method that the ratio W/L of the gate width W to the gate length L of each of the transistors $Q_{101}$ to $Q_{106}$ constructing the CMOS inverters 103 to 105 is optimized. However, since it is impossible to meet all of requests for various conversion speeds, there is a problem such that as an actual countermeasure, in many cases, a high speed A/D converter which can cover from several MHz to tens of MHz is used under a sacrifice of the current consumption.

OBJECTS AND SUMMARY OF THE INVENTION

It is, therefore, an object of the invention to provide a chopper comparator which can realize a necessary conversion speed without sacrificing a current consumption and an A/D converter using such a chopper comparator.

To accomplish the above object, according to the first aspect of the invention, there is provided a chopper comparator comprising: a CMOS inverter of at least one stage or more; a power source for supplying a. power voltage to the CMOS inverter; a capacitor; an input terminal for an analog input voltage connected to the CMOS inverter through the capacitor; an input terminal for a reference voltage connected to the CMOS inverter through the capacitor; a switch connected between the input terminal for the analog input voltage and the capacitor; a switch connected between the input terminal for the reference voltage and the capacitor; a switch connected between input and output terminals of the CMOS inverter; and current control means which is connected between the CMOS inverter and the power source of the CMOS inverter and controls a current flowing in the CMOS inverter.

According to the second aspect of the invention, there is provided a chopper comparator, comprising: a CMOS inverter of at least one stage or more; a power source for supplying a power voltage to the CMOS inverter; a capacitor; an input terminal for an analog input voltage connected to the CMOS inverter through the capacitor; an input terminal for a reference voltage connected to the CMOS inverter through the capacitor; a switch connected between the input terminal for the analog input voltage and the capacitor; a switch connected between the input terminal for the reference voltage and the capacitor; and a switch connected between input and output terminals of the CMOS inverter, wherein means which controls a voltage between a source and a drain of n-channel MOS type field effect transistor constructing the CMOS inverter so as to be lower than the power voltage of the CMOS inverter is connected between the CMOS inverter and the power source of the CMOS inverter.

According to the third aspect of the invention, there is provided an A/D converter comprising: a chopper comparator including a CMOS inverter of at least one stage or more and current control means which is connected between the CMOS inverter and a power source of the CMOS inverter and controls a current flowing in the CMOS inverter; means for generating a current control signal for controlling the current control means in accordance with a selection signal which is supplied from the outside; and clock signal generating means which is connected to the current control signal generating means and supplies a clock signal to the chopper comparator.

According to the first and third aspects of the invention constructed as mentioned above, the current flowing in the CMOS inverter is controlled by the current control means connected between the CMOS inverter and the power source of the CMOS inverter. Thus, a current consumption of the chopper comparator can be controlled.

According to the second aspect of the invention constructed as mentioned above, since the voltage between the source and drain of the n-channel MOS type field effect transistor constructing the CMOS inverter is controlled so as to be lower than the voltage of the power source of the CMOS inverter, a margin for a withstanding voltage between the source and drain of the n-channel MOS type field effect transistor constructing the CMOS inverter increases.

The above and other objects and features of the present invention will become apparent from the following detailed description and the appended claims with reference to the accompanying drawings.

DETAILED DESCRIPTION OF THE PREFERRED EMBODIMENTS

Embodiments of the invention will now be described hereinbelow with reference to the drawings. In all of the drawings of the embodiments, the same or corresponding component elements are designated by the same reference numerals. In the first to fifth embodiments of the invention, a chopper comparator which is used for an A/D converter of the flash type or 2-step flash type will now be described.

Figure 3:
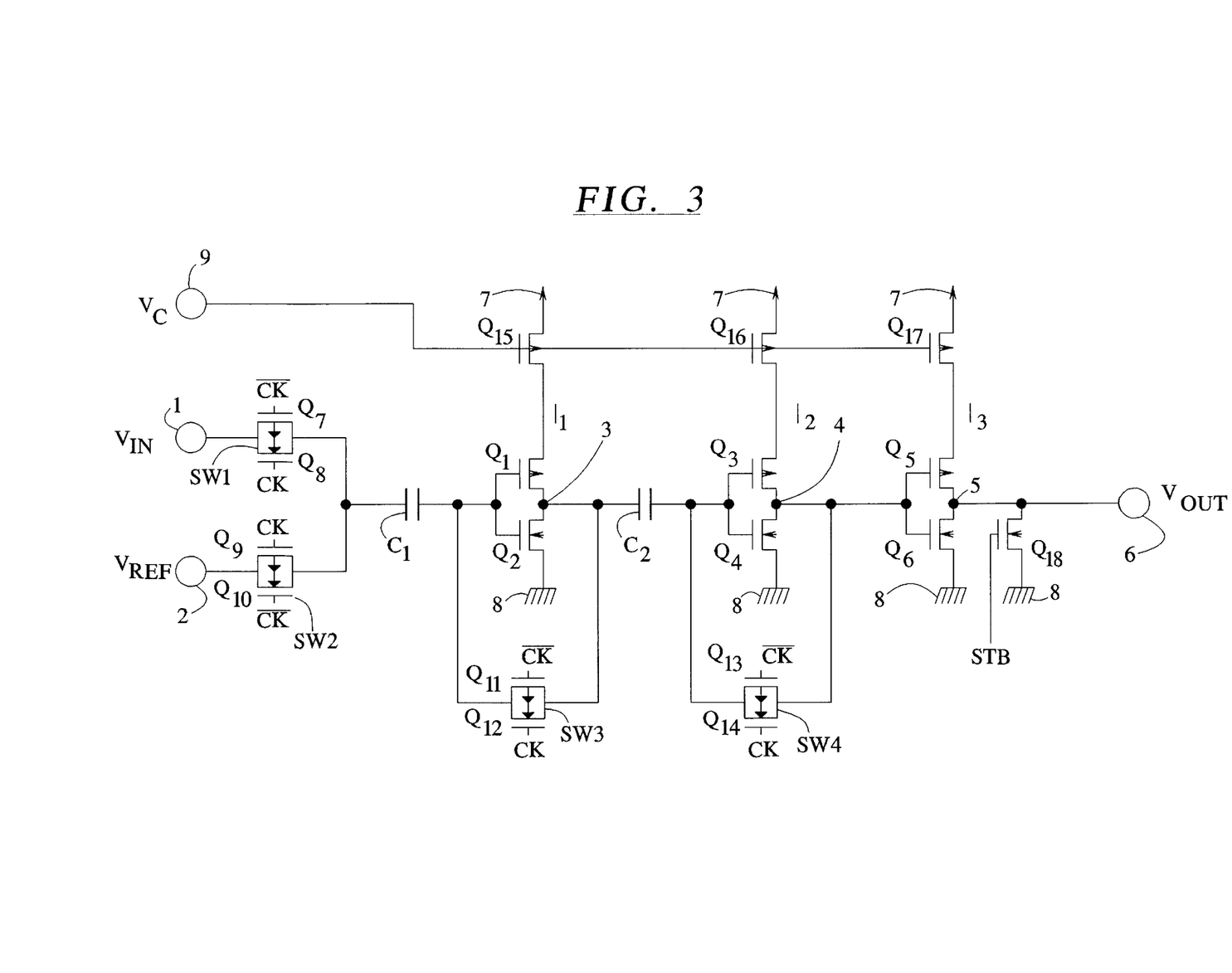
FIG. 3 is a circuit diagram showing a chopper comparator according to the first embodiment of the invention.

FIG. 3 is a circuit diagram showing the chopper comparator according to the first embodiment of the invention.

As shown in FIG. 3, the chopper comparator has: an input terminal 1 for the analog input voltage $V_{IN}$; an input terminal 2 for the reference voltage $V_{ref}$; CMOS inverters 3 to 5 of three stages; an output terminal 6 of the output voltage $V_{OUT}$; capacitors $C_1$ and $C_2$; and switches SW1 to SW4 constructed by CMOS analog switches.

The input terminals 1 and 2 are connected to one end of the capacitor $C_1$ through the switches SW1 and SW2. The other end of the capacitor $C_1$ is connected to an input terminal of the CMOS inverter 3. An output terminal of the CMOS inverter 3 is connected to an input terminal of the CMOS inverter 4 through the capacitor $C_2$. The input and output terminals of the CMOS inverter 3 are connected through the switch SW3. Similarly, the input and output terminals of the CMOS inverter 4 are connected through the switch SW4. The output terminal of the CMOS inverter 4 is connected to an input terminal of the CMOS inverter 5. An output terminal of the CMOS inverter 5 is connected to the output terminal 6 and the output voltage $V_{OUT}$ is taken out from the output terminal 6.

Reference numeral 7 denotes a power source for supplying the power voltage $V_{DD}$ and 8 indicates a power source for supplying the power voltage $V_{SS}$. Reference characters $Q_1$ to $Q_6$ indicate transistors constructing the CMOS inverters 3 to 5. In this case, the transistors $Q_1$, $Q_3'$, and $Q_5$ are p-channel MOSFETs as load transistors. The transistors $Q_2$, $Q_4'$, and $Q_6$ are n-channel MOSFETs as driver transistors.

Reference numerals $Q_7$ to $Q_{14}$ denote transistors constructing the switches SW1 to SW4. The clock signal CK or inverted clock signal $\overline{CK}$ is supplied to the transistors $Q_7$ to $Q_{14}$. Thus, ON/OFF operations of the switches SW1 to SW4 are controlled. In this case, the switches SW1, SW3, and SW4 are turned on for a period of time during which the clock signal CK is at the high level and is turned off for a period of time of the low level. On the other hand, the switch SW2 is turned on for a period of time during which the clock signal CK is at the low level and is turned off for a period of time of the high level.

In addition to the above construction similar to that of the conventional chopper comparator, the chopper comparator has: current control transistors $Q_{15}$ to $Q_{17}$ for controlling the currents flowing in the CMOS inverters 3 to 5; an output control transistor $Q_{18}$ for controlling the output of the output terminal 6; and a control terminal 9 for a control signal $V_C$ which is supplied from the outside.

In this case, p-channel MOSFETs are used as current control transistors $Q_{15}$ to $Q_{17}$. Those current control transistors $Q_{15}$ to $Q_{17}$ are connected between the CMOS inverters 3 to 5 and the power source 7 for supplying the power voltage $V_{DD}$. The control signal $V_C$ from the control terminal 9 is supplied to gates of the current control transistors $Q_{15}$ to $Q_{17}$. The control signal $V_C$ is used for controlling the currents flowing in the CMOS inverters 3 to 5 by controlling the switching operations of the current control transistors $Q_{15}$ to $Q_{17}$ in accordance with a voltage of the control signal $V_C$. In this case, as a control signal $V_C$, different voltages of three levels of, for example, 0[V], $[V_{DD}-(V_{thp}+\alpha)][V]$, and $V_{DD}[V]$ are used. $V_{thp}$ indicates a threshold voltage of the current control transistors $Q_{15}$ to $Q_{17}$. In this instance, 0[V] is the voltage that is sufficiently lower than the threshold voltage $V_{thp}$. $[V_{DD}-(V_{thp}+\alpha)][V]$ is the voltage that is higher than 0[V] and is lower than the threshold voltage $V_{thp}$. $V_{DD}$ is the voltage that is sufficiently higher than the threshold voltage $V_{thp}$.

When the control signal $V_C=0$, therefore, the current control transistors $Q_{15}$ to $Q_{17}$ are completely turned on and the currents flowing in the CMOS inverters 3 to 5 through the current control transistors $Q_{15}$ to $Q_{17}$ become maximum.

When the control signal $V_C=V_{DD}-(V_{thp}+\alpha)[V]$, the current control transistors $Q_{15}$ to $Q_{17}$ are turned on. However, the currents flowing in the CMOS inverters 3 to 5 through the current control transistors $Q_{15}$ to $Q_{17}$ are decreased as compared with those in case of the control signal $V_C=0[V]$.

On the other hand, when the control signal $V_C=V_{DD}[V]$, the current control transistors $Q_{15}$ to $Q_{17}$ are perfectly turned off and no current flows in the CMOS inverters 3 to 5.

An n-channel MOSFET is used as an output control transistor $Q_{18}$. The output control transistor $Q_{18}$ is connected to an output terminal of the CMOS inverter 5 at the final stage, therefore, is connected between the output terminal 6 of the chopper comparator and the power source 8 for supplying the power voltage $V_{SS}$. A control signal STB from the outside is supplied to a gate of the output control transistor $Q_{18}$. The control signal STB is used for controlling the output of the chopper comparator by controlling the switching operation of the output control transistor $Q_{18}$ in accordance with the voltage. The voltages at two levels corresponding to the high level and the low level are selected as a control signal STB. In this instance, when the control signal STB is set to the high level, the output control transistor $Q_{18}$ is turned on and the voltage at the output terminal 6 is fixed to the power voltage $V_{SS}$. When the control signal STB is set to the low level, the output control transistor $Q_{18}$ is turned off and the voltage of the output terminal 6 is equal to the voltage of the output signal $V_{OUT}$ from the CMOS inverter 5.

In the chopper comparator constructed as mentioned above, the operating mode is switched to any one of a normal operating mode, a low current consumption operating mode, and a standby mode in accordance with the control signal $V_C$ which is supplied from the outside. The chopper comparator is set to the normal operating mode when the control signal $V_C=0[V]$ and is set to the low current consumption operating mode when the control signal $V_C=V_{DD}-(V_{thp}+\alpha)[V]$. In case of the normal operating mode and low current consumption operating mode, the control signal STB for output control which is supplied from the outside is set to the low level. When the control signal $V_C=V_{DD}[V]$, the chopper comparator is set to the standby mode. In case of the standby mode, the control signal STB is set to the high level.

The operation in the normal operating mode of the chopper comparator will now be described. In case of the normal operating mode, when the clock signal CK is set to the high level, the switches SW1, SW3, and SW4 are turned on and the switch SW2 is turned off. For this period of the time, the analog input voltage $V_{IN}$ from the input terminal 1 is supplied to the capacitor $C_1$ and is sampled and the self-offset cancellation of the CMOS inverters 3 and 4 is executed. For the sampling period of time, predetermined operation currents $I_1$ to $I_3$ flow in the CMOS inverters 3 to 5. When the input/output terminals of the CMOS inverters 3 to 5 are set to the equal potential, the operation currents $I_1$ to $I_3$ correspond to DC currents flowing in the CMOS inverters 3 to 5. In the normal operating mode, the operation currents $I_1$ to $I_3$ of the CMOS inverters 3 to 5 in the sampling period of time become maximum.

Subsequently, when the clock signal CK is set to the low level, the switches SW1, SW3, and SW4 are turned off and the switch SW2 is turned on. For this period of time, the reference voltage $V_{ref}$ from the input terminal 2 is supplied to the capacitor $C_1$ and the level of the analog input voltage $V_{IN}$ which has already been sampled before and the level of the reference voltage $V_{ref}$ are compared. The voltage which is applied to the capacitor $C_1$ is inverted by the CMOS inverter 3. Further, the output of the CMOS inverter 3 is amplified by the CMOS inverters 4 and 5 and is outputted as an output voltage $V_{OUT}$ from the output terminal 6. In this case, when $V_{IN} \geq V_{ref}$, the output voltage $V_{OUT}$ corresponding to "1" is outputted. When $V_{IN} < V_{ref}$, the output voltage $V_{OUT}$ corresponding to "0" is outputted. For this comparing period of time, the operation currents $I_1$ to $I_3$ of the CMOS inverters 3 to 5 are equal to almost 0.

In response to the clock signal CK, the above sampling operation and comparing operation are repeated hereinbelow.

The operation in the low current consumption operating mode of the chopper comparator is also similar to the operation in the foregoing normal operating mode. In case of the low current consumption operating mode, the operation currents $I_1$ to $I_3$ flowing in the CMOS inverters 3 to 5 through the current control transistors $Q_{15}$ to $Q_{17}$ are reduced as compared with those in the case where the control signal $V_C=0[V]$. In this case, the desired operation currents $I_1$ to $I_3$ can be supplied to the CMOS inverters 3 to 5 in accordance with a value of $\alpha$.

On the other hand, in the standby mode of the chopper comparator, since the current control transistors $Q_{15}$ to $Q_{17}$ are OFF, the operation currents $I_1$ to $I_3$ of the CMOS inverters 3 to 5 are equal to 0. In case of the standby mode, the chopper comparator doesn't operate as a comparator. In this case, since the output control transistor $Q_{18}$ is turned on, the voltage of the output terminal 6 is fixed to the power voltage $V_{SS}$.

Figure 4A:
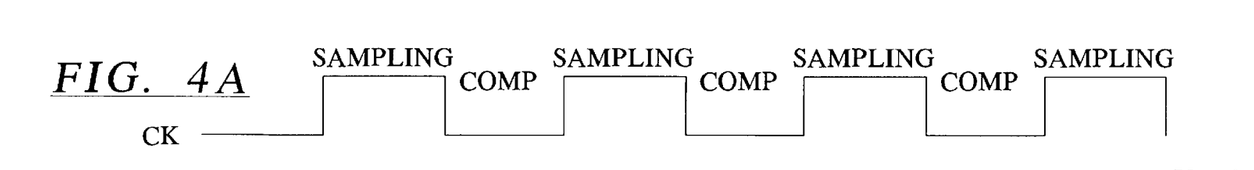
FIGS. 4A and 4B are schematic diagrams in association with the operation of the chopper comparator according to the first embodiment of the invention.
Figure 4B:
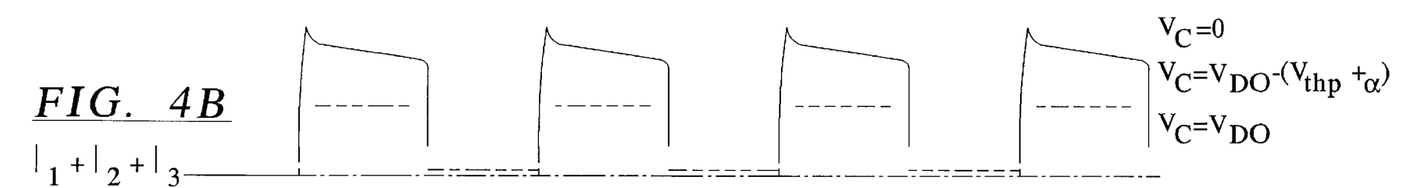

FIGS. 4A and 4B are schematic diagrams showing a current consumption in association with the operation of the chopper comparator. FIG. 4A shows a waveform of the clock signal CK and FIG. 4B shows a waveform of the consumption current. In FIG. 4B, a solid line shows the current consumption in case of the normal operating mode in which the control signal $V_C=0[V]$, a broken line shows the current consumption in case of the low current consumption operating mode in which the control signal $V_C=[V_{DD}-(V_{thp}+\alpha)][V]$, and an alternate long and short dash line indicates the current consumption in case of the standby mode in which the control signal $V_C=V_{DD}[V]$. In the chopper comparator, the currents other than the operation currents $I_1$ to $I_3$ of the CMOS inverters 3 to 5 are hardly consumed. Therefore, the current consumption of the chopper comparator is equal to the sum $(I_1+I_2+I_3)$ of the operation currents $I_1$ to $I_3$ of the CMOS inverters 3 to 5.

In the chopper comparator, as show n in FIGS. 4A and 4B, in case of the normal mode in which the control signal $V_C=0[V]$, the operation currents $I_1$ to $I_3$ of the CMOS inverters 3 to 5 become maximum, so that the current consumption of the chopper comparator becomes maximum. In this case, the conversion speed of the chopper comparator becomes highest and the maximum ability of the chopper comparator is most effectively provided.

In case of the low current consumption operating mode in which the control signal $V_C=[V_{DD}-(V_{thp}+\alpha)][V]$, the current consumption of the chopper comparator is suppressed as compared with that in the normal operating mode. In this case, the chopper comparator operates at a conversion speed lower than that in the normal operating mode. In the low current consumption operating mode, the current consumption of the chopper comparator and the conversion speed of the chopper comparator are determined to desired values in accordance with the value of $\alpha$ of the control signal $V_C$.

On the other hand, in case of the standby mode in which the control signal $V_C=V_{DD}[V]$, since the operation currents $I_1$ to $I_3$ of the CMOS inverters 3 to 5 are equal to almost 0, the current consumption of the chopper comparator is equal to almost 0.

According to the chopper comparator constructed as mentioned above, the current control transistors $Q_{15}$ to $Q_{17}$ are connected between the CMOS inverters 3 to 5 and the power source 7 to supply the power voltage $V_{DD}$ and the currents flowing in the CMOS inverters 3 to 5 are controlled in accordance with the control signal $V_C$ which is supplied from the outside, so that the current control transistors $Q_{15}$ to $Q_{17}$ can obtain the following effects.

That is, the operation currents $I_1$ to $I_3$ of the CMOS inverters 3 to 5, therefore, the current consumption of the chopper comparator can be controlled in accordance with the control signal $V_C$. Since the current consumption of the chopper comparator can be controlled as mentioned above, in case of using the chopper comparator in a high speed range, the current consumption is increased and in case of using the chopper comparator in a low speed range, the current consumption is reduced, so that it is possible to cope with such cases. The optimum power management can be realized.

According to the chopper comparator, the voltage between the source and drain of each of transistors $Q_2$, $Q_4$ and $Q_6$ (driver transistors comprising n-channel MOSFETs) constructing the CMOS inverters 3 to 5 can be reduced to a value lower than the power voltage $V_{DD}$ in accordance with the control signal $V_C$ by the current control transistors $Q_{15}$ to $Q_{17}$ connected between the CMOS inverters 3 to 5 and the power source 7 to supply the power voltage $V_{DD}$. Therefore, a margin of a withstanding voltage between the source and drain of each of the transistors $Q_2$, $Q_4$, and $Q_6$ can be increased.

Figure 5:
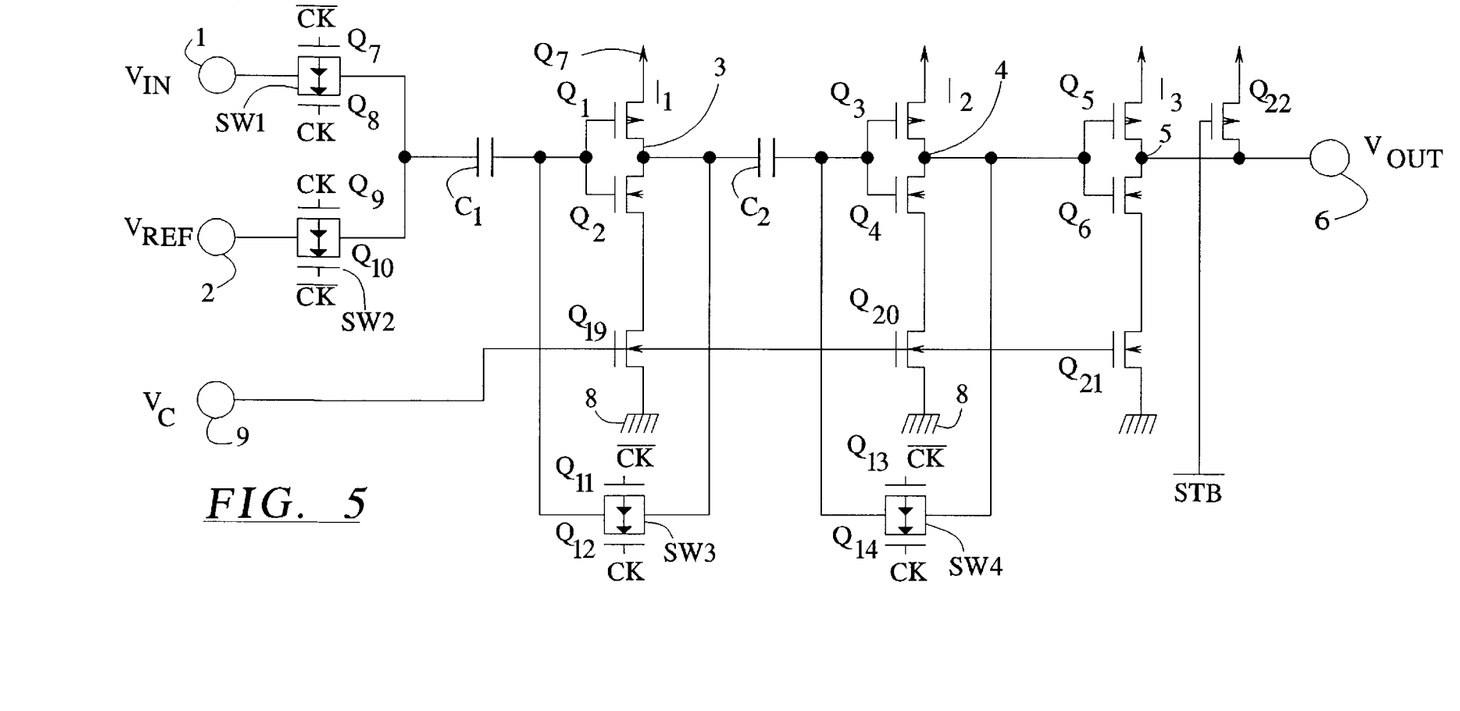
FIG. 5 is a circuit diagram showing a chopper comparator according to the second embodiment of the invention.

FIG. 5 is a circuit diagram showing a chopper comparator according to the second embodiment of the invention.

As shown in FIG. 5, in the chopper comparator, current control transistors $Q_{19}$ to $Q_{21}$ comprising n-channel MOSFETs are used in place of the current control transistors $Q_{15}$ to $Q_{17}$ comprising p-channel MOSFETs. In this case, the current control transistors $Q_{19}$ to $Q_{21}$ are connected between the CMOS inverters 3 to 5 and the power source 8 to supply the power voltage $V_{SS}$. The control signal $V_C$ from the control terminal 9 is supplied to gates of the current control transistors $Q_{19}$ to $Q_{21}$.

An output control transistor $Q_{22}$ comprising a p-channel MOSFET is used in place of the output control transistor $Q_{18}$ comprising an n-channel MOSFET. In this case, the output control transistor $Q_{22}$ is connected between the output terminal 6 and the power source 7 to supply the power voltage $V_{DD}$. An inverted signal of the control signal STB, namely, control signal $\overline{STB}$ is supplied to a gate of the output control transistor $Q_{22}$.

In the chopper comparator, a conductivity type of channels of the current control transistors $Q_{19}$ to $Q_{21}$ is a conductivity type opposite to that in the first embodiment. Therefore, the control signal $V_C$ to control the operation currents $I_1$ to $I_3$ of the CMOS inverters 3 to 5 differs from that in the first embodiment. That is, in case of the normal operating mode, the control signal $V_C=V_{DD}$. In case of the low current consumption operating mode, the control signal $V_C$ is set to a predetermined voltage that is equal to or higher than the threshold voltage $V_{thn}$ of the current control transistors $Q_{19}$ to $Q_{21}$. In case of setting the standby mode, the control signal $V_C=0[V]$.

Since the other construction is similar to that of the chopper comparator according to the first embodiment, its description is omitted. According to the second embodiment, effects similar to those in the first embodiment are also derived.

Figure 6:
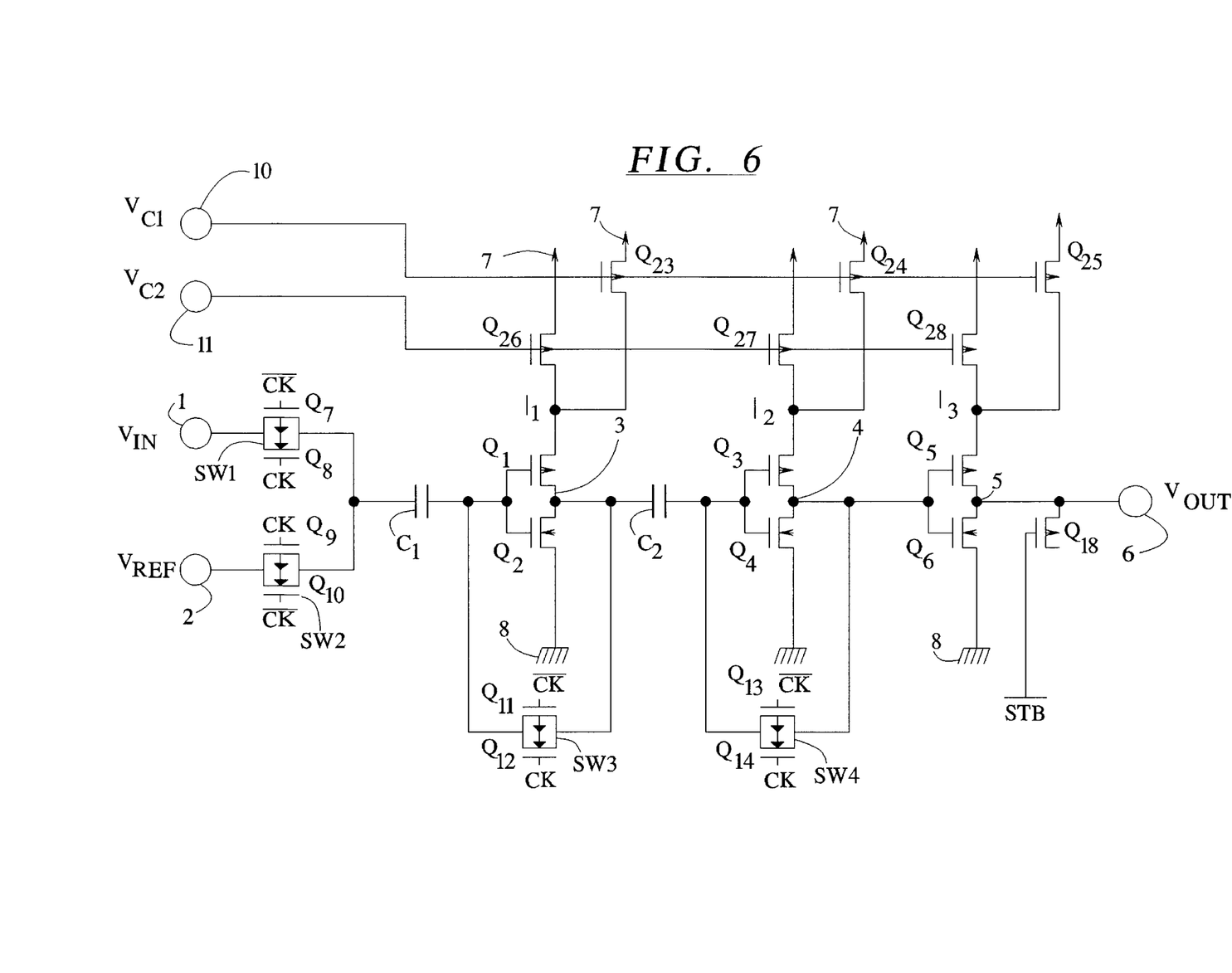
FIG. 6 is a circuit diagram showing a chopper comparator according to the third embodiment of the invention.

FIG. 6 is a circuit diagram showing a chopper comparator according to the third embodiment of the invention.

As shown in FIG. 6, in the chopper comparator, the first current control transistors $Q_{23}$ to $Q_{25}$ and second current control transistors $Q_{26}$ to $Q_{28}$ comprising p-channel MOSFETs are provided in place of the current control transistors $Q_{15}$ to $Q_{17}$. The first current control transistor $Q_{23}$ and second current control transistor $Q_{26}$ are connected in parallel between the CMOS inverter 3 and the power source 7 to supply the power voltage $V_{DD}$. Similarly, the first current control transistor $Q_{24}$ and second current control transistor $Q_{27}$ are connected in parallel between the CMOS inverter 4 and the power source 7 to supply the power voltage $V_{DD}$. The first current control transistor $Q_{25}$ and second current control transistor $Q_{28}$ are connected in parallel between the CMOS inverter 5 and the power source 7 to supply the power voltage $V_{DD}$.

In place of the control terminal 9 for the control signal $V_C$ which is supplied from the outside, a control terminal 10 for a control signal $V_{C1}$ which is supplied from the outside and a control terminal 11 for a control signal $V_{C2}$ are provided. The control signal $V_{C1}$ from the control terminal 10 is supplied to gates of the first current control transistors $Q_{23}$ to $Q_{25}$. The control signal $V_{C2}$ from the control terminal 11 is supplied to gates of the second current control transistors $Q_{26}$ to $Q_{28}$.

In the chopper comparator, by selecting either one of the control signals $V_{C1}$ and $V_{C2}$, the operating mode is controlled by using either ones of the first current control transistors $Q_{23}$ to $Q_{25}$ and the second current control transistors $Q_{26}$ to $Q_{28}$.

In this case, by setting the control signals $V_{C1}$ and $V_{C2}$ to desired different voltages and by using either one of the control signals $V_{C1}$ and $V_{C2}$ as necessary, the low current consumption operating mode can be switched. Thus, in case of making the chopper comparator operative in the low current consumption operating mode, it can be operated at different conversion speeds in case of using the first current control transistors $Q_{23}$ to $Q_{25}$ and in case of using the second current control transistors $Q_{26}$ to $Q_{28}$, respectively.

Since the other construction is similar to that of the chopper comparator according to the first embodiment, its description is omitted here. According to the third embodiment, effects similar to those in the first embodiment can be obtained.

Figure 7:
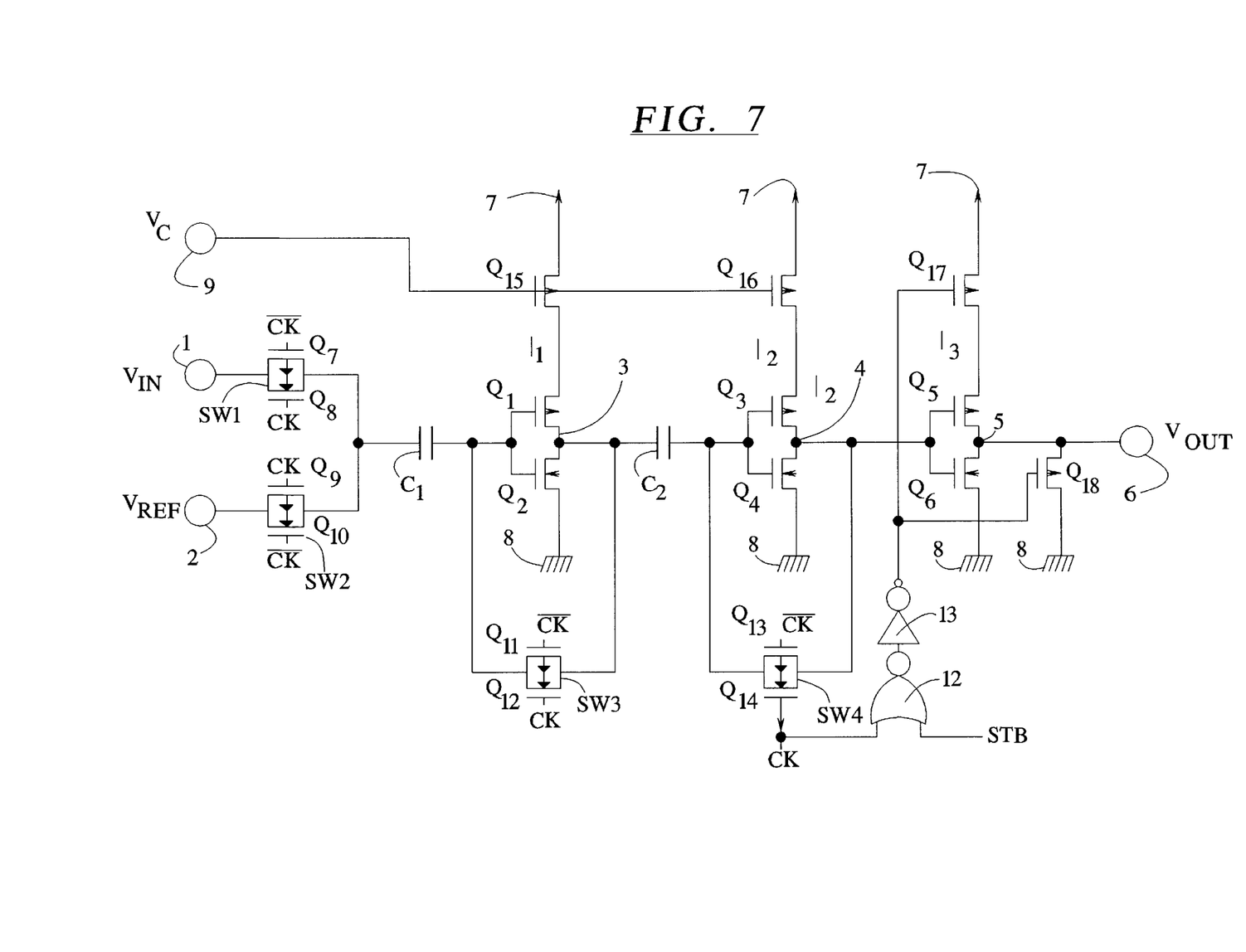
FIG. 7 is a circuit diagram showing a chopper comparator according to the fourth embodiment of the invention.

FIG. 7 is a circuit diagram showing a chopper comparator according to the fourth embodiment of the invention.

As shown in FIG. 7, the chopper comparator further has an NOR gate 12 and an inverter 13. The control signal STB from the outside is supplied to one input terminal of the NOR gate 12 and the clock signal CK is supplied to the other input terminal. An output terminal of the NOR gate 12 is connected to a gate of the current control transistor $Q_{17}$ through the inverter 13 and is connected to a gate of the output control transistor $Q_{18}$. The CMOS inverter 5 at the final stage to which the current control transistor $Q_{17}$ is connected is a CMOS inverter in which a self-offset cancellation is not performed for the sampling period of time.

In the chopper comparator, when the control signal STB and/or the clock signal CK are set to the high level, an output of the NOR gate 12 is set to the low level, so that an output of the inverter 13 is set to the high level. Therefore, for the sampling period of time during which the clock signal CK is set to the high level, in other words, for the period of time during which the self-offset cancellation is executed in the CMOS inverters 3 and 4, the current control transistor $Q_{17}$ is turned off and the operation current $I_3$ is not supplied to the CMOS inverter 5 in which the self-offset cancellation is not performed.

Since the other construction is similar to that of the chopper comparator according to the first embodiment, its description is omitted. According to the fourth embodiment, effects similar to those in the first embodiment can be obtained.

Figure 8:
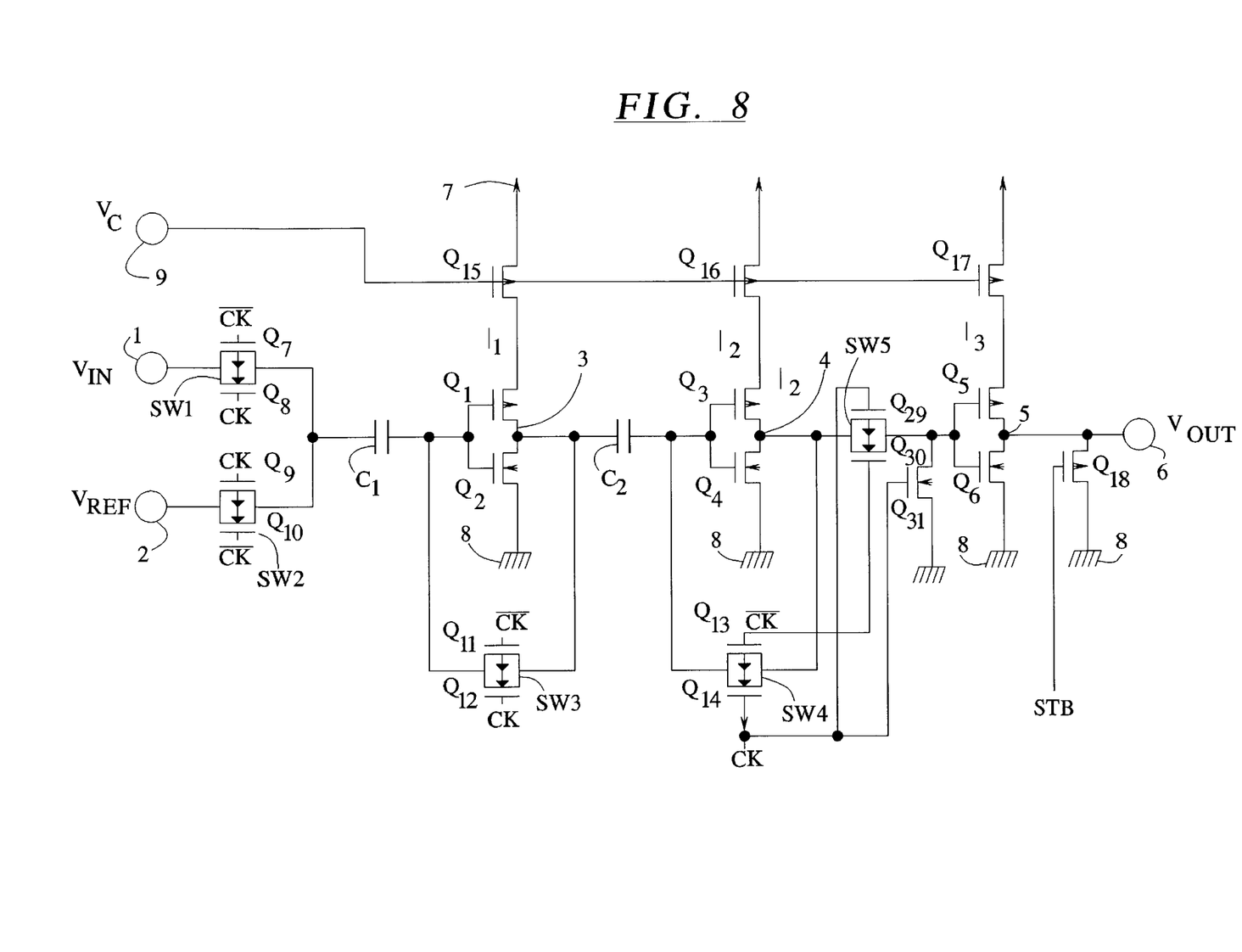
FIG. 8 is a circuit diagram showing a chopper comparator according to the fifth embodiment of the invention.

FIG. 8 is a circuit diagram showing a chopper comparator according to the fifth embodiment of the invention.

As shown in FIG. 8, according to the chopper comparator, a switch SW5 comprising a CMOS analog switch is provided between an output terminal of the CMOS inverter 4 and an input terminal of the CMOS inverter 5. $Q_{29}$ and $Q_{28}$ denote transistors constructing the switch SW5. A transistor $Q_{31}$ comprising an n-channel MOSFET is provided between the input terminal of the CMOS inverter 5 and the power source 8 to supply the power voltage $V_{SS}$. In this case, in transistors $Q_{29}$ and $Q_{30}$ constructing the switch SW5, a gate of the transistor $Q_{29}$ is connected to a gate of the transistor $Q_{14}$ of the switch SW4 and a gate of the transistor $Q_{30}$ is connected to a gate of the transistor $Q_{13}$ of the switch SW4. A gate of the transistor $Q_{31}$ is connected to the gate of the transistor $Q_{29}$ of the switch SW5.

In the chopper comparator, when the clock signal CK is set to the high level, the switch SW5 is turned off and the transistor $Q_{31}$ is turned on. Therefore, for the sampling period of time during which the clock signal CK is set to the high level, in other words, for the period of time during which the self-offset cancellation is executed in the CMOS inverters 3 and 4, the voltage at the input terminal of the CMOS inverter 5 in which the self-offset cancellation is not performed is set to the power voltage $V_{SS}$ and the operation current $I_3$ is not supplied to the CMOS inverter 5.

Since the other construction is similar to that of the chopper comparator according to the first embodiment, its description is omitted. According to the fifth embodiment, effects similar to those in the first embodiment can be obtained.

Figure 9:
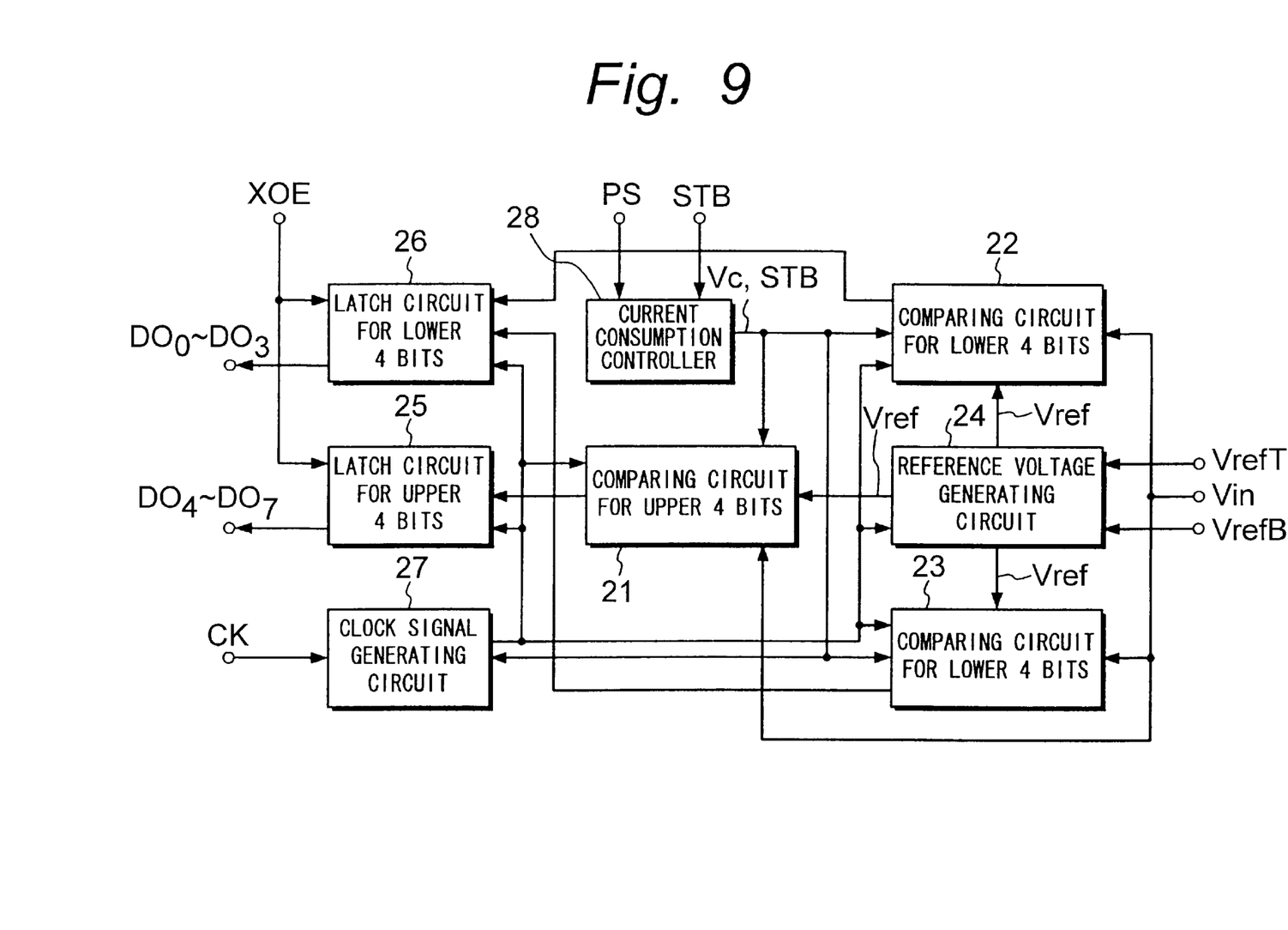
FIG. 9 is a block diagram showing an example of an A/D converter of a 2-step flash type according to the sixth embodiment of the invention.

An A/D converter according to the sixth embodiment of the invention will now be described. FIG. 9 is a block diagram showing the A/D converter according to the sixth embodiment. A case where the invention is applied to an A/D converter of a 2-step flash type of eight bits will now be described.

As shown in FIG. 9, the A/D converter has a comparing circuit 21 for upper four bits, comparing circuits 22 and 23 for lower four bits, a reference voltage generating circuit 24, a latch circuit 25 for upper four bits, and a latch circuit 26 for lower four bits. The comparing circuit 21 for upper four bits and comparing circuits 22 and 23 for lower four bits are connected to the reference voltage generating circuit 24. The comparing circuit 21 for upper four bits is connected to the latch circuit 25 for upper four bits. The comparing circuits 22 and 23 for lower four bits are connected to the latch circuit 26 for lower four bits.

The analog input voltage $V_{IN}$ is inputted from the outside to the comparing circuit 21 for upper four bits and comparing circuits 22 and 23 for lower four bits. A reference voltages $V_{refT}$ and $V_{refB}$ are supplied from the outside to the reference voltage generating circuit 24. The reference voltage $V_{refT}$ corresponds to a voltage of the most significant bit of a quantization level. The reference voltage $V_{refB}$ corresponds to a voltage of the least significant bit of the quantization level. The reference voltage generating circuit 24 divides a voltage between the reference voltages $V_{refT}$ and $V_{refB}$ by using a resistor train (not shown), thereby generating the reference voltage $V_{ref}$ corresponding to the quantization level. The reference voltage $V_{ref}$ from the reference voltage generating circuit 24 is supplied to the comparing circuit 21 for upper four bits and comparing circuits 22 and 23 for lower four bits.

In order to perform the A/D conversion of four bits, each of the comparing circuit 21 for upper four bits and comparing circuits 22 and 23 for lower four bits is made up of $15(=2^4-1)$ chopper comparators corresponding to the quantization level. The comparing circuit 21 for upper four bits and comparing circuits 22 and 23 for lower four bits have auxiliary chopper comparators as necessary. Therefore, actually, the analog input voltage $V_{IN}$ which is supplied from the outside to the comparing circuit 21 for upper four bits and comparing circuits 22 and 23 for lower four bits is inputted in parallel to all of the chopper comparators constructing those comparing circuits. The reference voltage $V_{ref}$ corresponding to the quantization level which is supplied from the reference voltage generating circuit 24 is inputted to the corresponding chopper comparator. In this case, any ones of the chopper comparators according to the first to fifth embodiments can be used as chopper comparators constructing the comparing circuit 21 for upper four bits and comparing circuits 22 and 23 for lower four bits.

In the A/D converter, the inputted analog input voltage $V_{IN}$ is A/D converted into digital signals $DO_0$ to $DO_7$ of eight bits divisionally at two steps of the conversion of upper four bits and the conversion of lower four bits.

That is, in the first step, the levels of the analog input voltage $V_{IN}$ and reference voltage $V_{ref}$ are compared by each chopper comparator in the comparing circuit 21 for upper four bits. In the second step, the levels of the analog input voltage $V_{IN}$ and reference voltage $V_{ref}$ are compared by each chopper comparator in the comparing circuit 22 or 23 for lower four bits. In the A/D converter, two sets of comparing circuits 22 and 23 for lower four bits alternately operate (interleaving operation) for one set of comparing circuit 21 for upper four bits. In accordance with an output result of the comparing circuit 21 for upper four bits, the level of the reference voltage $V_{ref}$ which is supplied to the comparing circuits 22 and 23 for lower four bits is switched.

The digital outputs $DO_4$ to $DO_7$ of upper four bits from the comparing circuit 21 for upper four bits are supplied to the latch circuit 25 for upper four bits. The digital outputs $DO_0$ to $DO_3$ of lower four bits from the comparing circuits 22 and 23 for lower four bits are supplied to the latch circuit 26 for lower four bits. The digital outputs $DO_4$ to $DO_7$ of upper four bits of the latch circuit 25 for upper four bits and the digital outputs $DO_0$ to $DO_3$ of lower four bits of the latch circuit 26 for lower four bits are read out at predetermined timings, so that the digital outputs $DO_0$ to $DO_7$ corresponding to the inputted analog input voltage $V_{IN}$ are derived. XOE denotes an enable signal which is supplied from the outside in order to permit the output of the latch circuits 25 and 26.

Reference numeral 27 denotes a clock signal generating circuit for supplying the clock signal CK serving as a reference of the operation to the comparing circuit 21 for upper four bits, comparing circuits 22 and 23 for lower four bits, reference voltage generating circuit 24, latch circuit 25 for upper four bits, and latch circuit 26 for lower four bits, respectively. The clock signal generating circuit 27 forms various internal clocks on the basis of a signal from the outside and generates the clock signal CK.

In addition to the above construction, the A/D converter has a current consumption controller 28 connected to the comparing circuit 21 for upper four bits, comparing circuits 22 and 23 for lower four bits, and clock signal generating circuit 27. The current consumption controller 28 generates the control signal $V_C$ in response to a control signal PS and control signal STB which are supplied from the outside, supplies the control signal $V_C$ to the comparing circuit 21 for upper four bits and comparing circuits 22 and 23 for lower four bits, and supplies the control signal STB to the comparing circuit 21 for upper four bits, comparing circuits 22 and 23 for lower four bits, and clock signal generating circuit 27, respectively. The control signal PS is a control signal to select consumption currents of the comparing circuit 21 for upper four bits and comparing circuits 22 and 23 for lower four bits. In the case where the chopper comparator according to the first embodiment is used as chopper comparators constructing the comparing circuit 21 for upper four bits and comparing circuits 22 and 23 for lower four bits, the control signal $V_C$ from the current consumption controller 28 is supplied to the control terminal 9 for the control signal $V_C$ and the control signal STB is supplied to a gate of the output control transistor $Q_{18}$.

FIG. 10 is a circuit diagram showing an example of a construction of the current consumption controller 28. As shown in FIG. 10, the current consumption controller 28 is made up of NOR gates 31 and 32, inverters 33 to 35, transistors $Q_{41}$ to $Q_{46}$, and a resistor 36. The control signal STB is inputted to the NOR gate 31 and the control signal PS is inputted thereto through the inverter 33. The control signals STB and PS are inputted to the NOR gate 32. The control signal STB is inputted to the inverter 34.

The transistors $Q_{41}$ and $Q_{42}$ are constructed by p-channel MOSFETs and their sources are connected to a power source to supply the power voltage $V_{DD}$. The transistors $Q_{43}$ and $Q_{44}$ are constructed by n-channel MOSFETs and their sources are connected to a power source to supply the power voltage $V_{SS}$. The transistor $Q_{45}$ comprising a p-channel MOSFET and the transistor $Q_{46}$ comprising an n-channel MOSFET construct a CMOS analog switch. A drain of the transistor $Q_{41}$ is connected to a common node at which the control signal $V_C$ is outputted through the CMOS analog switch comprising the transistors $Q_{45}$ and $Q_{46}$ and a drain of the transistor $Q_{42}$ is connected to the common node. A drain of the transistor $Q_{43}$ is connected to the common node and a drain of the transistor $Q_{44}$ is connected thereto through the resistor 36. The control signal $V_C$ from the current consumption controller 28 is supplied to the control terminal 9 for the control signal $V_C$ of the chopper comparator shown in FIG. 3.

In the above current consumption controller 28, an output $S_1$ of the NOR gate 31 is supplied to a gate of the transistor $Q_{41}$ and an output $S_2$ of the NOR gate 32 is supplied to the transistor $Q_{43}$. The output $S_2$ of the NOR gate 32 is supplied to a gate of the transistor $Q_{45}$ constructing one of the transistors of the CMOS analog switch and is supplied to a gate of the transistor $Q_{46}$ constructing the other one of the transistors of the CMOS analog switch through the inverter 35. An output $S_3$ of the inverter 34 is supplied to a gate of the transistor $Q_{44}$. The drain of the transistor $Q_{41}$ is connected to a gate of the transistor $Q_{42}$. Therefore, the current consumption controller 28 outputs the control signal $V_C$ as shown in Table 1 in response to the control signals STB and PS which are supplied from the outside.

TABLE 1

| STB | PS | CONTROL SIGNAL $V_c$ [V] | OPERATING MODE |
|---|---|---|---|
| H | H | $V_{DD}$ | STANDBY |
| H | L | $V_{DD}$ | STANDBY |
| L | H | $V_{DD} - (V_{thp} + \alpha)$ | LOW CURRENT CONSUMPTION OPERATION |
| L | L | 0 | NORMAL OPERATION |

That is, as shown in Table 1, when the control signal STB is at the high level, the voltage of the control signal $V_C$ is equal to $V_{DD}$[V] irrespective of the control signal PS. In this case, each chopper comparator constructing the comparing circuit 21 for upper four bits and comparing circuits 22 and 23 for lower four bits is set to the standby mode. The current consumption of the comparing circuit 21 for upper four bits and comparing circuits 22 and 23 for lower four bits is equal to 0. In this case, the supply of the clock signal CK from the clock signal generating circuit 27 is also stopped. Thus, the operation of the A/D converter is stopped.

When the control signal STB is at the low level and the control signal PS is at the high level, the voltage of the control signal $V_C$ is set to $[V_{DD}-(V_{thp}+\alpha)]$[V]. In this case, each chopper comparator constructing the comparing circuit 21 for upper four bits and comparing circuits 22 and 23 for lower four bits operates in the low current consumption operating mode. The current consumption of the comparing circuit 21 for upper four bits and comparing circuits 22 and 23 for lower four bits is saved. Thus, the conversion speed of the A/D converter is set to a low speed.

When the control signal STB is at the low level and the control signal PS is at the low level, the voltage of the control signal $V_C$ is equal to 0[V]. In this case, each chopper comparator constructing the comparing circuit 21 for upper four bits and comparing circuits 22 and 23 for lower four bits operates in the normal operating mode. The current consumption of the comparing circuit 21 for upper four bits and comparing circuits 22 and 23 for lower four bits becomes maximum. Thus, the conversion speed of the A/D converter is set to a high speed and the maximum ability of the A/D converter is effectively provided.

According to the A/D converter constructed as mentioned above, the following effects can be obtained.

That is, by controlling the current consumption of each chopper comparator constructing the comparing circuit 21 for upper four bits and comparing circuits 22 and 23 for lower four bits, the conversion speeds of the chopper comparators can be controlled. Therefore, since the different conversion speeds of two stages can be set in the A/D converter, although two kinds of A/D converters were used hitherto, it is possible to cope by one kind of A/D converter.

When the A/D converter is built in an LSI such as a microcomputer or the like having a high generality, the current consumption can be set in accordance with a request of the conversion speed for the A/D converter. In the case where the A/D converter has a plurality of input channels and these plurality of input channels are time-divisionally switched, the optimum current consumption can be selected in accordance with the conversion speed of each input channel and the current consumption can be set to 0 for a period of time during which the A/D converter is not used.

Thus, the optimum power management can be realized in accordance with the operating mode of the A/D converter.

Although the embodiments of the invention have specifically been described above, the invention is not limited to the above embodiments but various modifications based on the technical idea of the invention are possible. For example, the chopper comparators according to the first to fifth embodiments can be also constructed by CMOS inverters of three or less stages or by CMOS inverters of three or more stages.

In the above fourth embodiment, the NOR gate 12 and inverter 13 can be also provided every chopper comparator or can be also commonly used by a plurality of chopper comparators according to circumstances.

For example, in the sixth embodiment, an A/D converter of the flash type can be also used as an A/D converter.

As described above, according to the invention, the current flowing in the CMOS inverter is controlled by the current control means connected between the CMOS inverter constructing the chopper comparator and the power source of the CMOS inverter. Therefore, the chopper comparator which can realize a necessary conversion speed and the A/D converter using such a chopper comparator can be obtained without sacrificing the current consumption.

The present invention is not limited to the foregoing embodiments but many modifications and variations are possible within the spirit and scope of the appended claims of the invention.

What is claimed is:

1. A chopper comparator comprising:

a CMOS inverter of at least one stage or more;

a power source for supplying a power voltage to the CMOS inverter;

a capacitor;

an input terminal for an analog input voltage connected to said CMOS inverter through said capacitor;

an input terminal for a reference voltage connected to said CMOS inverter through said capacitor;

a switch connected between said input terminal for the analog input voltage and said capacitor;

a switch connected between said input terminal for the reference voltage and said capacitor;

a switch connected between input and output terminals of said CMOS inverter; and current control means which is connected between said CMOS inverter and said power source of said CMOS and controls a current flowing in said CMOS inverter, wherein said output control means for controlling an output of said chopper comparator is connected between the output terminal of said CMOS inverter at the final stage and said power source of said CMOS inverter.

2. A chopper comparator according to claim 1, wherein said current control means is constructed by an MIS type field effect transistor of a first conductivity type channel connected between said CMOS inverter and a first power source of said CMOS inverter, and said output control means is constructed by an MIS type field effect transistor of a second conductivity type channel connected between the output terminal of said CMOS inverter at said final stage and a second power source of said CMOS inverter.

3. A chopper comparator according to claim 2, wherein said current control means is constructed by a p-channel MIS type field effect transistor connected between said CMOS inverter and a power source to supply a first power voltage to said CMOS inverter, and said output control means is constructed by an n-channel MIS type field effect transistor connected between the output terminal of said CMOS inverter at said final stage and a power source to supply a second power voltage to said CMOS inverter.

4. A chopper comparator according to claim 2, wherein said current control means is constructed by an n-channel MIS type field effect transistor connected between said CMOS inverter and a power source to supply a third power voltage to said CMOS inverter, and said output control means is constructed by a p-channel MIS type field effect transistor connected between the output terminal of said CMOS inverter at said final stage and a power source to supply a fourth power voltage to said CMOS inverter.

5. A chopper comparator comprising:

a CMOS inverter of at least one stage or more;

a power source for supplying a power voltage to the CMOS inverter;

a capacitor;

an input terminal for an analog input voltage connected to said CMOS inverter through said capacitor;

an input terminal for a reference voltage connected to said CMOS inverter through said capacitor;

a switch connected between said input terminal for the analog input voltage and said capacitor;

a switch connected between said input terminal for the reference voltage and said capacitor;

a switch connected between input and output terminals of said CMOS inverter; and current control means which is connected between said CMOS inverter and said power source of said CMOS and controls a current flowing in said CMOS inverter; and further having a first CMOS inverter in which a self-offset cancellation is performed for a sampling period of time and a second CMOS inverter in which a self-offset cancellation is not performed, wherein said current control means is connected to each of said first and second CMOS inverters, wherein a circuit between an output terminal of said first CMOS inverter and an input terminal of said second CMOS inverter which are adjacent to each other is shut off for said sampling period of time, and a predetermined voltage is applied to said input terminal of said second CMOS inverter.

6. An A/D converter comprising:

a chopper comparator including a CMOS inverter of at least one stage or more and current control means which is connected between said CMOS inverter and a power source of said CMOS inverter and controls a current flowing in said CMOS inverter;

means for generating a current control signal for controlling said current control means in accordance with a selection signal which is supplied from the outside; and clock signal generating means which is connected to said current control signal generating means and supplies a clock signal to said chopper comparator wherein a circuit between an output terminal of said first CMOS inverter and an input terminal of said second CMOS inverter which are adjacent to each other is shut off for said sampling period of time, and a predetermined voltage is applied to said input terminal of said second CMOS inverter.

7. An A/D converter according to claim 6, wherein said A/D converter is a flash type A/D converter.

8. An A/D converter according to claim 6, wherein said A/D converter is a 2-step flash type A/D converter.

* * * * *